United States Patent
Moriya et al.

(10) Patent No.: US 10,224,291 B2
(45) Date of Patent: Mar. 5, 2019

(54) SEMICONDUCTOR DEVICE PACKAGE WITH STRIP LINE STRUCTURE AND HIGH FREQUENCY SEMICONDUCTOR DEVICE THEREOF

(71) Applicant: Kabushiki Kaisha Toshiba, Minato-ku (JP)

(72) Inventors: Osamu Moriya, Yokohama (JP); Tomohiro Senju, Ota (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 52 days.

(21) Appl. No.: 15/407,566

(22) Filed: Jan. 17, 2017

(65) Prior Publication Data

US 2017/0373017 A1   Dec. 28, 2017

(30) Foreign Application Priority Data

Jun. 23, 2016  (JP) .................. 2016-124415

(51) Int. Cl.
*H01L 23/552*   (2006.01)
*H01L 23/057*   (2006.01)
(Continued)

(52) U.S. Cl.
CPC .......... *H01L 23/552* (2013.01); *H01L 23/057* (2013.01); *H01L 23/66* (2013.01);
(Continued)

(58) Field of Classification Search
CPC ..... H01L 23/552; H01L 23/057; H01L 23/66; H01L 24/48; H01L 2223/6683; H01L 2223/6611; H01L 2224/16227
(Continued)

(56) References Cited

U.S. PATENT DOCUMENTS 3,784,884 A * 1/1974 Zoroglu ................ H01L 23/66
                                                    257/664
4,172,261 A * 10/1979 Tsuzuki ................ H01L 23/047
                                                    257/706
(Continued)

FOREIGN PATENT DOCUMENTS

JP    5-299570 A   11/1993
JP    8-46073 A    2/1996
(Continued)

*Primary Examiner* — Mohammad M Hoque
(74) *Attorney, Agent, or Firm* — Oblon, McClelland, Maier & Neustadt, L.L.P.

(57) ABSTRACT

A high frequency semiconductor device package includes a metal plate, a frame body, a first lead part, a second lead part, a first conductive layer, and a second conductive layer. The frame body includes a first frame part made and a second frame part. The first frame part has a lower surface bonded to the metal plate. The first frame part has an upper surface including a first region and a second region. The first lead part protrudes outward along a line passing through a central part of the first region and a central part of the second region in plan view. The second lead part protrudes outward along the line in plan view. The first conductive layer includes a first stripe part and a first connection part. The second conductive layer includes a second stripe part and a second connection part.

8 Claims, 5 Drawing Sheets

(51) Int. Cl.
  *H01L 23/66* (2006.01)
  *H01L 23/00* (2006.01)
(52) U.S. Cl.
  CPC ...... *H01L 24/48* (2013.01); *H01L 2223/6611* (2013.01); *H01L 2223/6683* (2013.01); *H01L 2224/16227* (2013.01)
(58) Field of Classification Search
  USPC .......................................................... 257/659
  See application file for complete search history.

(56) References Cited

U.S. PATENT DOCUMENTS

| | | | | |
|---|---|---|---|---|
| 4,427,991 A * | 1/1984 | Yamamura | ............ | H01L 23/047 257/664 |
| 4,908,694 A * | 3/1990 | Hidaka | ............. | H01L 23/49844 257/664 |
| 5,294,897 A * | 3/1994 | Notani | ..................... | H01L 23/66 257/676 |
| 5,371,321 A * | 12/1994 | Hamzehdoost | ....... | H01L 23/055 174/538 |
| 5,455,453 A * | 10/1995 | Harada | ............... | H01L 21/4835 257/500 |
| 5,572,065 A * | 11/1996 | Burns | ..................... | H01L 21/50 257/666 |
| 5,574,314 A * | 11/1996 | Okada | ..................... | H01L 23/10 257/659 |
| 5,757,070 A * | 5/1998 | Fritz | ................... | H01L 23/4334 257/675 |
| 6,380,616 B1 * | 4/2002 | Tutsch | ................ | H01L 25/0652 257/686 |
| 6,455,932 B1 * | 9/2002 | Katahira | ................. | H01L 23/10 257/664 |
| 7,563,646 B2 * | 7/2009 | Carter | ................. | H01L 21/4803 438/118 |
| 7,838,990 B2 * | 11/2010 | Yamamoto | ........... | H05K 9/0056 257/664 |
| 8,754,519 B2 * | 6/2014 | Hasegawa | ............. | H01L 23/047 257/678 |
| 8,860,516 B2 * | 10/2014 | Nishio | ..................... | H03B 5/36 257/416 |
| 9,219,017 B2 * | 12/2015 | Takagi | ................... | H01L 23/047 |
| 9,578,770 B2 * | 2/2017 | Kodama | ................. | H01L 23/10 |
| 2004/0022476 A1 * | 2/2004 | Kirkpatrick | .......... | G02B 6/4201 385/14 |
| 2004/0046247 A1 * | 3/2004 | Tower | ..................... | H01L 23/10 257/708 |
| 2005/0035447 A1 * | 2/2005 | Basho | ................... | H01L 23/057 257/712 |
| 2005/0207092 A1 * | 9/2005 | Kubota | ................. | H01L 23/047 361/301.3 |
| 2005/0208789 A1 * | 9/2005 | Shirai | .................. | G02B 6/4201 439/66 |
| 2006/0139903 A1 * | 6/2006 | Takagi | ................... | H01L 23/047 361/764 |
| 2008/0099908 A1 * | 5/2008 | Wang | .................. | B81C 1/00269 257/704 |
| 2010/0019376 A1 * | 1/2010 | Senju | .................... | H01L 23/047 257/698 |
| 2010/0059271 A1 * | 3/2010 | Yoneda | ............... | H01L 23/3735 174/548 |
| 2011/0048796 A1 * | 3/2011 | Tsujino | ............. | H01L 23/49833 174/549 |
| 2011/0186979 A1 * | 8/2011 | Senju | ...................... | H01L 23/48 257/690 |
| 2011/0215970 A1 * | 9/2011 | Asahi | ....................... | H01Q 1/38 343/700 MS |
| 2013/0105205 A1 * | 5/2013 | Takagi | .................... | H01L 23/10 174/257 |
| 2013/0128489 A1 * | 5/2013 | Satake | .................. | H01L 23/057 361/820 |
| 2013/0136280 A1 * | 5/2013 | Stephanou | ............. | H04R 17/00 381/190 |
| 2014/0063757 A1 * | 3/2014 | Takagi | .................... | H01L 23/10 361/752 |
| 2014/0345929 A1 * | 11/2014 | Tsujino | ................. | H01L 23/057 174/260 |
| 2017/0125362 A1 * | 5/2017 | Zhang | .............. | H01L 23/49503 |

FOREIGN PATENT DOCUMENTS

| | | | |
|---|---|---|---|
| JP | 2011129571 A | * | 6/2011 |
| JP | 2011-165745 | | 8/2011 |
| JP | 5361694 | | 12/2013 |

* cited by examiner

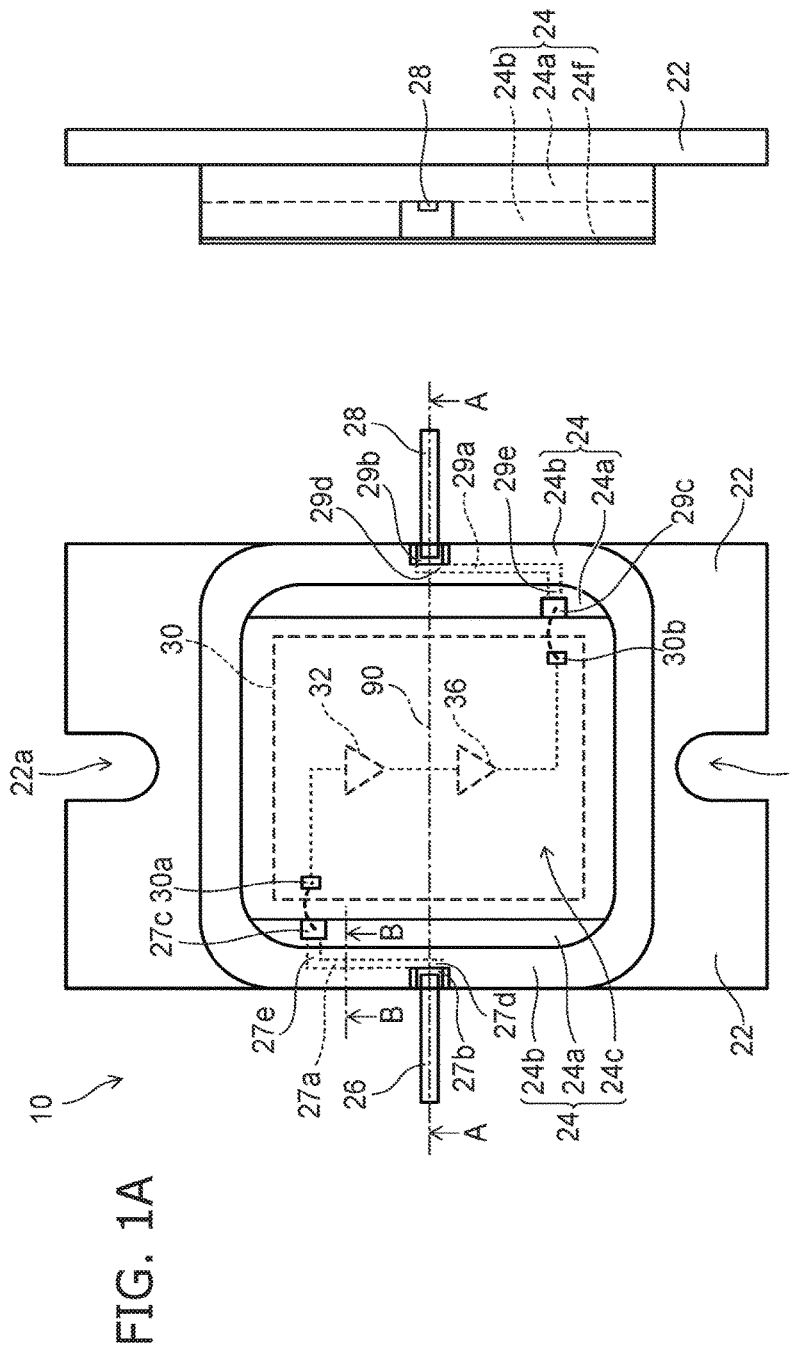
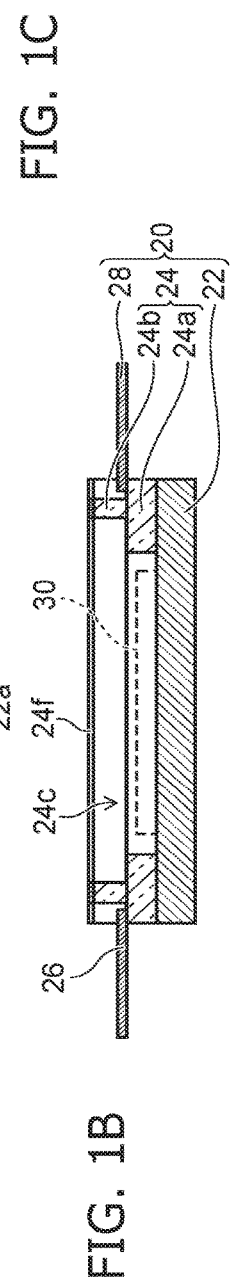

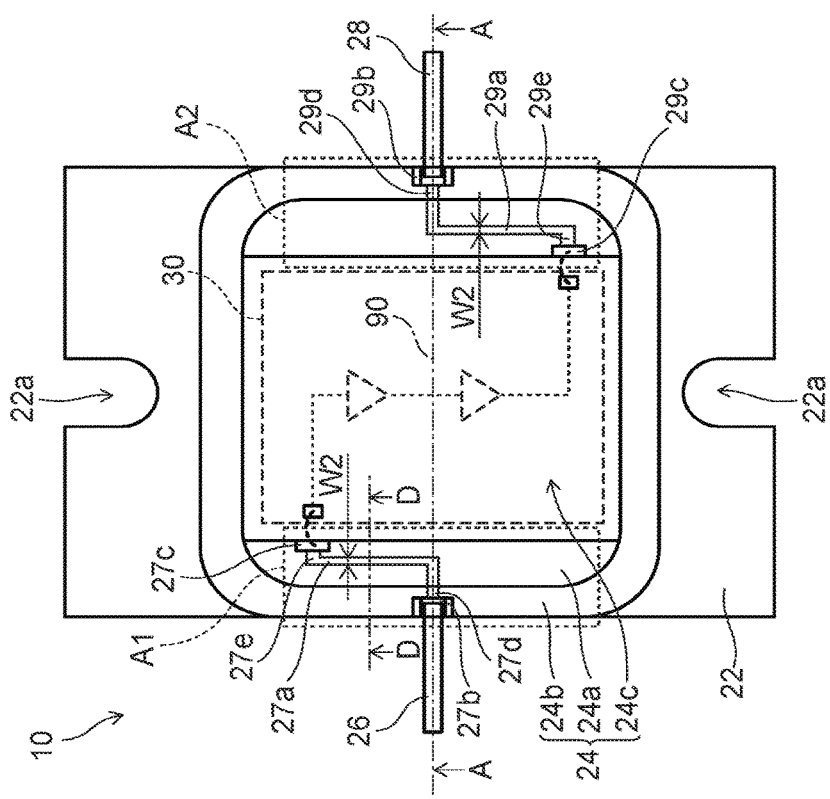
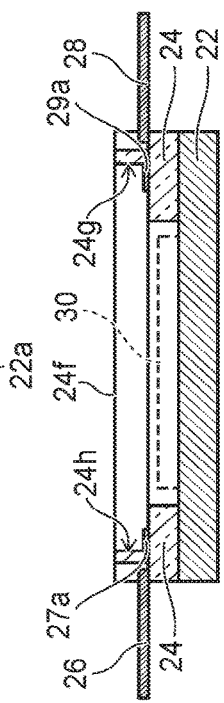
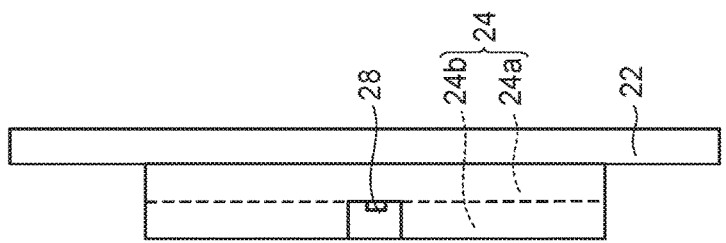

SEMICONDUCTOR DEVICE PACKAGE WITH STRIP LINE STRUCTURE AND HIGH FREQUENCY SEMICONDUCTOR DEVICE THEREOF

CROSS-REFERENCE TO RELATED APPLICATIONS

This application is based upon and claims the benefit of priority from Japanese Patent Application No. 2016-124415, filed on Jun. 23, 2016; the entire contents of which are incorporated herein by reference.

FIELD

Embodiments described herein relate generally a high frequency semiconductor device and a package therefore.

BACKGROUND

High frequency semiconductor elements cascaded on a line require an elongated package.

Heat dissipation performance of a high frequency semiconductor element such as HEMT (high electron mobility transistor) is improved when bonded onto a metal plate. This requires housing the high frequency semiconductor element in a frame body of e.g. ceramic in order to hermetically seal the high frequency semiconductor element.

In the process for manufacturing a package and/or the process for bonding a high frequency semiconductor element, the package warps due to the difference in linear expansion coefficient between the metal plate and the ceramic frame body. The amount of warpage of the package can be reduced by shaping the package like a square. However, the package is elongated with the increase in the number of cascaded elements.

BRIEF DESCRIPTION OF THE DRAWINGS

FIG. 1A is a schematic plan view of a high frequency semiconductor device package according to a first embodiment, FIG. 1B is a schematic sectional view taken along line A-A, and FIG. 1C is a schematic side view;

FIG. 6A is a schematic plan view of a high frequency semiconductor device package according to a second embodiment, FIG. 6B is a schematic sectional view taken along line A-A, and FIG. 6C is a schematic side view.

DETAILED DESCRIPTION

In general, according to one embodiment, a high frequency semiconductor device package includes a metal plate, a frame body, a first lead part, a second lead part, a first conductive layer, and a second conductive layer. The high frequency semiconductor device package is bonded to a lid part and capable of hermetically sealing its internal space. The frame body includes a first frame part made of ceramic and a second frame part made of ceramic. The first frame part and the second frame part are sintered. The first frame part has a lower surface bonded to the metal plate. The second frame part has an upper surface that can be bonded to the lid part. And the first frame part has an upper surface including a first region and a second region on an opposite side of the first region. The first lead part protrudes outward along a line passing through a central part of the first region and a central part of the second region in plan view. The second lead part protrudes outward along the line in plan view. The first conductive layer includes a first stripe part and a first connection part. The first stripe part extends on the first region outward from the central part of the first region so as to be generally orthogonal to the line and having a prescribed width. The first connection part is bonded with the first lead part. And one end part of the first stripe part is electrically connected to the first connection part. The second conductive layer includes a second stripe part and a second connection part. The second stripe part extends on the second region from the central part of the second region to a direction opposite from extending direction of the first stripe part so as to be generally orthogonal to the line and having a prescribed width. The second connection part is bonded with the second lead part. And one end part of the second stripe part is electrically connected to the second connection part.

Embodiments of the invention will now be described with reference to the drawings.

FIG. 1A is a schematic plan view of a high frequency semiconductor device package according to a first embodiment. FIG. 1B is a schematic sectional view taken along line A-A. FIG. 1C is a schematic side view.

Figure 2:
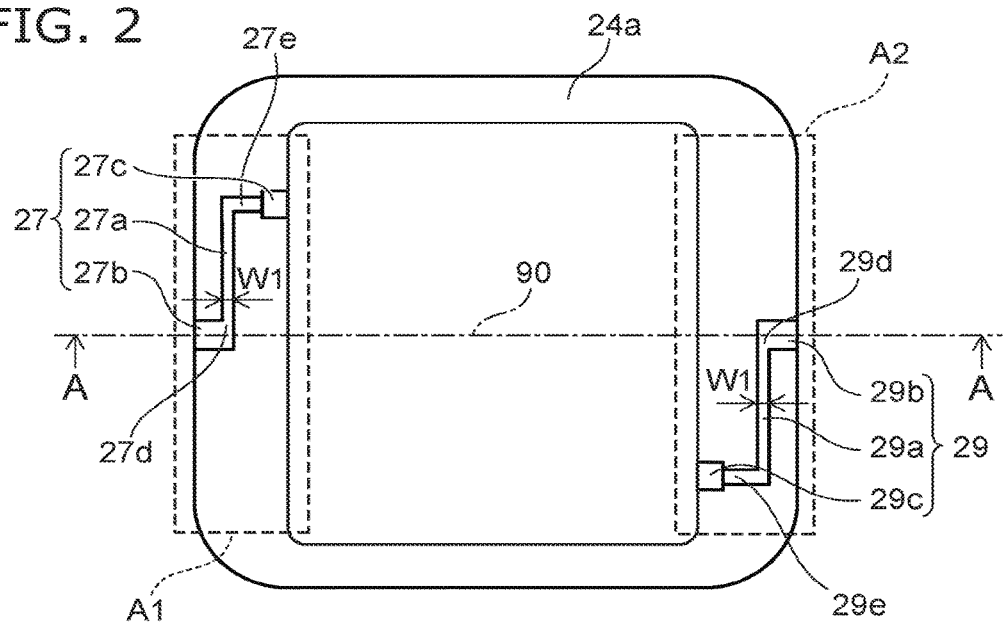
FIG. 2 is a schematic plan view of a first frame part.

FIG. 2 is a schematic plan view of a first frame part.

The high frequency semiconductor device package 10 includes a metal plate 22, a frame body 24, a first conductive layer 27, a second conductive layer 29, a first lead part 26, and a second lead part 28. The high frequency semiconductor device package 10 can be bonded to a lid part to hermetically seal its internal space.

The frame body 24 includes a first frame part 24a made of e.g. ceramic and a second frame part 24b made of e.g. ceramic, which are sintered. The lower surface of the first frame part 24a is bonded to the metal plate 22. The upper surface of the second frame part 24b can be bonded to the lid part. The ceramic can be e.g. Al$_2$O$_3$ or AlN.

The metal plate 22 can be made of e.g. CuW, CuMo, MoW, Cu, CuMo composite or Cu/Mo/Cu laminate. The metal plate 22 is bonded to the first frame part 24a with e.g. silver brazing alloy (having a melting point of e.g. 780-900° C.).

As shown in FIG. 2, the upper surface of the first frame part 24a has a first region A1 and a second region A2 on the opposite side of the first region A1.

The first conductive layer 27 includes a first stripe part 27a and a first connection part 27b. The first stripe part 27a extends on the first region A1 outward from the central part of the first region A1 (the portion traversed by the line 90) so as to be generally orthogonal to the line 90. The first stripe part 27a has a prescribed width. The first connection part 27b is bonded with the first lead part 26. The first connection part 27b is electrically connected to one end part 27d of the first stripe part 27a. The other end part 27e of the first stripe part 27a can be connected to a first bonding pad part 27c.

The second conductive layer 29 includes a second stripe part 29a and a second connection part 29b. The second stripe part 29a extends on the second region A2 from the central part of the second region A2 (the portion traversed by the line 90) to the direction opposite from the extending direction of the first stripe part 27a so as to be generally orthogonal to the line 90. The second stripe part 29a has a prescribed width. The second connection part 29b is bonded with the second lead part 28. The second connection part 29b is electrically connected to one end part 29d of the second stripe part 29a. The other end part 29e of the second stripe part 29a can be connected to a second bonding pad part 29c. In this specification, the statement that the line 90 is generally orthogonal to the stripe part means that the crossing angle between the line and the stripe part is not less than 80 degrees and not more than 100 degrees.

The first conductive layer 27 and the second conductive layer 29 can be made of e.g. a thick film provided on a ceramic surface and containing metal particles.

The first connection part 27b is bent by generally 90 degrees with respect to the first stripe part 27a. The first bonding pad part 27c is bent to the opposite side by generally 90 degrees. The second connection part 29b is bent by generally 90 degrees with respect to the second stripe part 29a. The second bonding pad part 29c is bent to the opposite side by generally 90 degrees.

The first lead part 26 is bonded to the first connection part 27b of the first region A1 with e.g. silver brazing alloy (having a melting point of e.g. 780-900° C.). The second lead part 28 is bonded to the second connection part 29b of the second region A2 with e.g. silver brazing alloy. The first lead part 26 protrudes outward along the line 90 passing through the central part of the first region A1 and the central part of the second region A2. The second lead part 28 protrudes outward along the line 90.

In the first embodiment, although the first lead part 26 and the second lead part 28 are placed on the line 90, the input terminal 30a of the high frequency semiconductor element 30 including MMIC (monolithic microwave integrated circuit) can be spaced from the first lead part 26. The output terminal 30b of the high frequency semiconductor element 30 can be spaced from the second lead part 28. That is, the layout design in the high frequency semiconductor element 30 is highly flexible. For instance, even when the number of stages of amplification elements such as HEMT is increased, the interconnect direction can be made orthogonal to the line 90, or crossed obliquely with the line 90. Thus, there is no need to elongate the chip shape. This can suppress the elongation of the package and the increase in the amount of its warpage.

The width of the first stripe part 27a and the width of the second stripe part 29a can be determined so that the characteristic impedance of the transmission line is matched with the external load.

An upper surface conductive layer 24f can be provided on the upper surface of the second frame part 24b.

Figure 3:
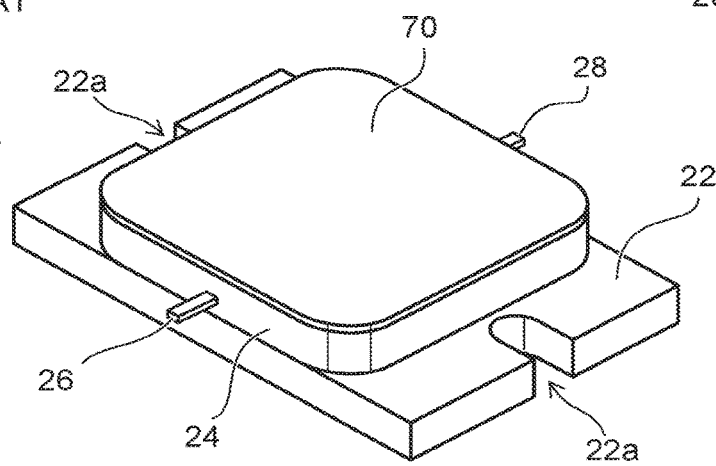
FIG. 3 is a schematic perspective view of the high frequency semiconductor device package bonded with a lid part.

FIG. 3 is a schematic perspective view of the high frequency semiconductor device package bonded with a lid part.

The lid part 70 is bonded to e.g. the upper surface conductive layer 24f (FIG. 1B) with e.g. AuSn solder (having a melting point of approximately 280° C.). The lid part 70 can be made of e.g. a metal plate or metallized ceramic. The conductive part of the lid part 70 can be electrically connected to the metal plate 22 via the side surface metallization of the frame body 24 to improve the electromagnetic shielding effect.

In the first embodiment, the first stripe part 27a and the second stripe part 29a can be considered as strip lines or microstrip lines.

Figure 4:
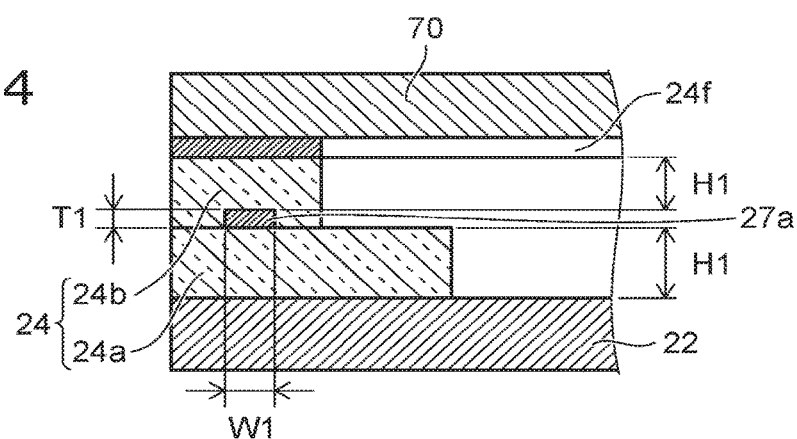
FIG. 4 is a partial schematic sectional view of the frame body taken along line B-B of FIG. 1A.

FIG. 4 is a partial schematic sectional view of the frame body taken along line B-B of FIG. 1A.

The characteristic impedance $Z_{01}$ of the strip line is given approximately by equation (1).

$$Z_{01} = \frac{60}{\sqrt{\varepsilon_r}} \times \ln\left[\frac{1.9 \times (2 \times H1 + T1)}{0.8 \times W1 + T1}\right] \qquad (1)$$

where W1 is interconnect pattern width, $\varepsilon_r$ is relative dielectric constant, H1 is dielectric layer height, and T1 is interconnect pattern thickness.

For the interconnect pattern width (prescribed width) W1=0.15 mm, the dielectric constant $\varepsilon_r$=10, the dielectric layer height H1=0.6 mm, and the conductive layer thickness T1=0.05 mm, the characteristic impedance can be set to $Z_{01}$=50Ω according to equation (1). Even if mismatch occurs at the connection of either end part of the stripe part, the characteristic impedance $Z_{01}$ can be set to 50Ω±10%. Thus, the impedance of the load side as viewed from the high frequency semiconductor element 30 can be set to 50Ω±10% by providing the first stripe part 27a and the second stripe part 29a. In the case where the first frame part 24a and the second frame part 24b have an equal thickness, the values of the characteristic impedance can be made equal when the width of the first stripe part 27a and the width of the second stripe part 29a are made equal.

Figure 5A:
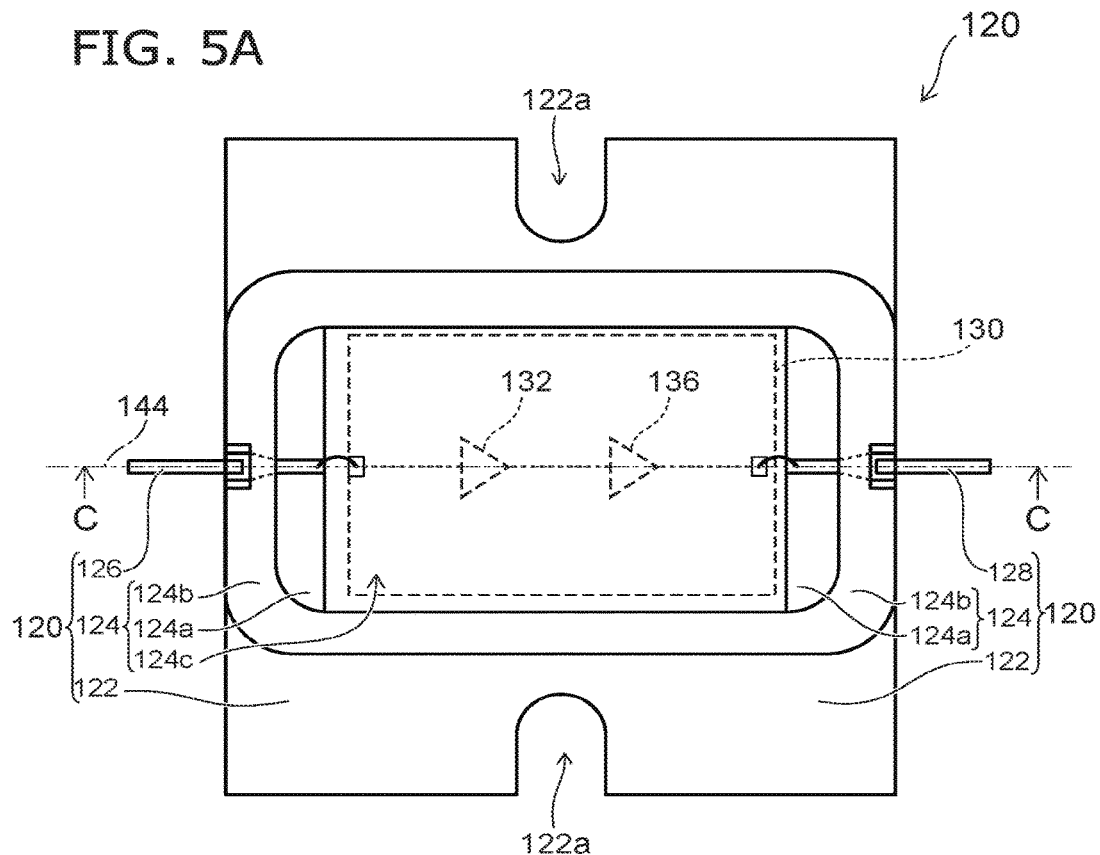
FIG. 5A is a schematic plan view of a high frequency semiconductor device package according to a comparative example.
Figure 5B:
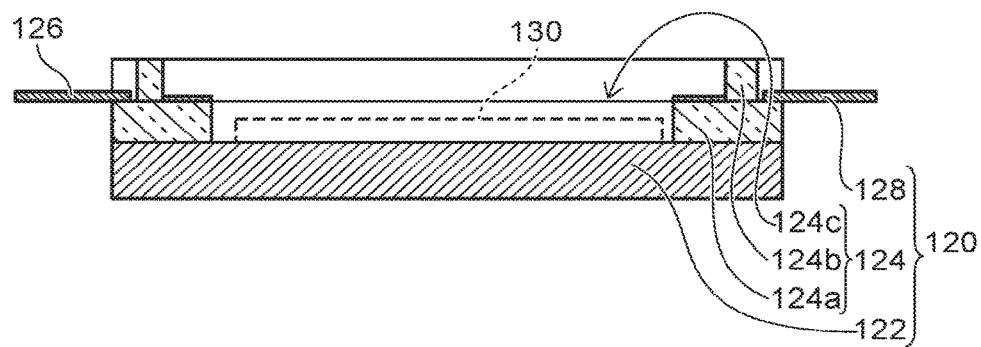
FIG. 5B is a schematic sectional view taken along line C-C.

FIG. 5A is a schematic plan view of a high frequency semiconductor device package according to a comparative example. FIG. 5B is a schematic sectional view taken along line C-C.

The package 120 includes a metal plate 122, a frame body 124, a first lead part 126, and a second lead part 128. The metal plate 122 is provided with an attachment hole 122a. The frame body 124 is provided with an opening 124c and includes a first frame part 124a and a second frame part 124b. The first lead part 126 is bonded to the conductive part of the first frame part 124a. The second lead part 128 is bonded to the conductive part of the second frame part 124b.

A high frequency semiconductor element 130 including MMIC is housed in the package 120. The high frequency semiconductor element 130 includes e.g. a first amplification element 132 and a second amplification element 136. The high frequency semiconductor element 130 is bonded to the metal plate 122 in the opening 124c. The input electrode of the first amplification element 132 is connected to the first lead part 126. The output electrode of the second amplification element 136 is connected to the second lead part 128.

In the comparative example, the first amplification element 132 and the second amplification element 136 are placed in horizontal symmetry across the center line 144. Thus, the MMIC 130 is shaped like a rectangle in which the length along the center line 144 between the first lead part 126 and the second lead part 128 is larger than the length along the line orthogonal to the center line 144. There is a large difference between the linear expansion coefficient of ceramic and the linear expansion coefficient of metal such as Cu. Thus, the package 120 is prone to warpage at the time of temperature decrease after the process for manufacturing the package 120 and the process for assembling the high frequency semiconductor element 130. Accordingly, a gap is more likely to occur with respect to the heat sink (not shown) and decreases the heat dissipation performance.

In contrast, in the first embodiment, the first amplification element 32 and the second amplification element 36 can be placed in a direction generally orthogonal to the line 90. Thus, the high frequency semiconductor element 30 can be shaped like a square. The package 20 includes a metal plate 22 provided with an attachment hole 22a, a frame body 24, a first lead part 26, and a second lead part 28. The warpage of the package 20 can be reduced, and the bonding strength can be enhanced. Furthermore, the thermal resistance between the package 20 and the heat sink can be reduced.

FIG. 6A is a schematic plan view of a high frequency semiconductor device package according to a second embodiment. FIG. 6B is a schematic sectional view taken along line A-A. FIG. 6C is a schematic side view.

The high frequency semiconductor device package 10 includes a metal plate 22, a frame body 24, a first conductive layer 27, a second conductive layer 29, a first lead part 26, and a second lead part 28. The high frequency semiconductor device package can be bonded to a lid part to hermetically seal its internal space.

The frame body 24 includes a first frame part 24a made of ceramic and a second frame part 24b made of ceramic, which are sintered. The lower surface of the first frame part 24a is bonded to the metal plate 22. The upper surface of the second frame part 24b can be bonded to the lid part.

The first region A1 of the first frame part 24a includes a region protruding inward from the inner edge 24h of the second frame part 24b. The second region A2 of the first frame part 24a includes a region protruding inward from the inner edge 24g of the second frame part 24b. The first stripe part 27a is provided on the protruding region of the first region A1. The second stripe part 29a is provided on the protruding region of the second region A2.

One end part 27d of the first stripe part 27a is electrically connected to the first connection part 27b of the first conductive layer 27, the first connection part 27b being bonded with the first lead part 26. One end part 29d of the second stripe part 29a is electrically connected to the second connection part 29b of the second conductive layer 29, the second connection part 29b being bonded with the second lead part 28.

Figure 7:
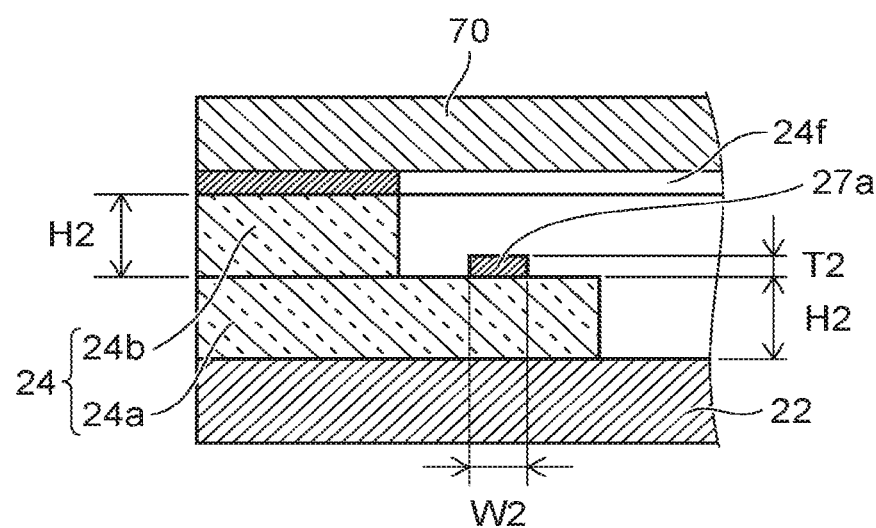
FIG. 7 is a schematic sectional view of the frame body taken along line D-D of FIG. 6A.

FIG. 7 is a schematic sectional view of the frame body taken along line D-D of FIG. 6A.

The characteristic impedance $Z_{o2}$ of the microstrip line is given approximately by equation (2).

$$Z_{o2} = \frac{87}{\sqrt{\varepsilon_r + 1.41}} \times \ln\left[\frac{5.98 \times H2}{0.8 \times W2 + T2}\right] \quad (2)$$

where W2 is interconnect pattern width, $\varepsilon_r$ is relative dielectric constant, H2 is dielectric layer height, and T2 is interconnect pattern thickness.

For the interconnect pattern width W2=0.36 mm, the dielectric constant $\varepsilon_r$=10, the dielectric layer height H2=0.4 mm, and the conductive layer thickness T2=0.05 mm, the characteristic impedance can be set to $Z_{o2}$=50Ω according to equation (2). Even if mismatch occurs at the connection of either end part of the stripe part, the characteristic impedance $Z_{o2}$ can be set to 50Ω±10%.

The first and second embodiments provide a high frequency semiconductor device package having high flexibility of layout in the high frequency semiconductor element and a reduced amount of warpage. The high frequency semiconductor device based on this high frequency semiconductor device package has an improved heat dissipation and package strength. Such a high frequency semiconductor device can be widely used for radars and communication equipment.

The embodiments have been described with reference to the matching circuit based on two-stage impedance transformation according to the invention. However, these embodiments have been presented as an example, and do not intend to limit the scope of the invention. The invention can also be practiced in matching circuits based on impedance transformation other than two-stage.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device package with a strip line structure comprising:
    a metal plate;
    a frame body including a first frame part made of ceramic and a second frame part made of ceramic, the first frame part and the second frame part being sintered, the first frame part having a lower surface bonded to the metal plate, the second frame part having an upper surface on which an upper surface conductive layer is provided, and the first frame part having an upper surface including a first region and a second region on an opposite side of the first region;
    a first lead part protruding outward along a line passing through a central part of the first region and a central part of the second region in plan view;
    a second lead part protruding outward along the line in plan view;
    a first conductive layer including a first stripe part, a first bonding pad part and a first connection part, the first stripe part extending on the first region outward from the central part of the first region so as to be generally orthogonal to the line, the first connection part being bonded with the first lead part, the first bonding pad part being provided on a first protruding region of the first region inward from an inner edge of the second frame part, one end part of the first stripe part being electrically connected to the first connection part; and
    a second conductive layer including a second stripe part, a second bonding pad part and a second connection part, the second stripe part extending on the second region from the central part of the second region to a direction opposite from extending direction of the first stripe part so as to be generally orthogonal to the line and having a prescribed width, the second connection part being bonded with the second lead part, the second bonding pad part being provided on a second protruding region of the second region inward from the inner edge of the second frame part, one end part of the second stripe part being electrically connected to the second connection part, another end part of the second stripe part being electrically connected to the second bonding pad part, wherein the metal plate, the first frame part, the first stripe part, the second frame part and the upper surface conductive layer being stacked in this order and constituting a first strip line, and the metal plate, the first frame part, the second stripe part, the second frame part and the upper surface conductive layer being stacked in this order and constituting a second strip line.

2. The package according to claim 1, wherein
the first stripe part is in contact with a lower surface of the second frame part, and
the second stripe part is in contact with the lower surface of the second frame part.

3. A high frequency semiconductor device comprising:
the semiconductor device package according to claim 1;
a high frequency semiconductor element having an input terminal and an output terminal and bonded to an upper surface of the metal plate surrounded with the first frame part;
a first bonding wire connecting the input terminal to the first bonding pad part; and
a second bonding wire connecting the output terminal to the second bonding pad part.

4. The device according to claim 3, wherein
the first stripe part is in contact with a lower surface of the second frame part, and
the second stripe part is in contact with the lower surface of the second frame part.

5. The device according to claim 3, wherein the high frequency semiconductor element includes a monolithic microwave integrated circuit.

6. The package according to claim 1, wherein
a characteristic impedance of the first strip line is 50 ohms, and
a characteristic impedance of the second strip line is 50 ohms.

7. A high frequency semiconductor device comprising:
the semiconductor device package according to claim 6;
a high frequency semiconductor element having an input terminal and an output terminal and bonded to an upper surface of the metal plate surrounded with the first frame part;
a first bonding wire connecting the input terminal to the first bonding pad part; and
a second bonding wire connecting the output terminal to the second bonding pad part.

8. The device according to claim 7, wherein the high frequency semiconductor element includes a monolithic microwave integrated circuit.

* * * * *